US012628501B2

(12) United States Patent
Yan et al.

(10) Patent No.: US 12,628,501 B2
(45) Date of Patent: May 12, 2026

(54) DISPLAY SUBSTRATE AND DISPLAY DEVICE

(71) Applicants: Hefei BOE Joint Technology Co., Ltd., Hefei (CN); BOE Technology Group Co., Ltd., Beijing (CN)

(72) Inventors: Longfei Yan, Beijing (CN); Di Wu, Beijing (CN)

(73) Assignees: Hefei BOE Joint Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 588 days.

(21) Appl. No.: 18/023,728

(22) PCT Filed: Jun. 30, 2022

(86) PCT No.: PCT/CN2022/102787
§ 371 (c)(1),
(2) Date: Feb. 28, 2023

(87) PCT Pub. No.: WO2024/000389
PCT Pub. Date: Jan. 4, 2024

(65) Prior Publication Data
US 2024/0276777 A1 Aug. 15, 2024

(51) Int. Cl.
*H10K 59/122* (2023.01)
*H10K 59/131* (2023.01)
*H10K 59/35* (2023.01)

(52) U.S. Cl.
CPC ......... *H10K 59/122* (2023.02); *H10K 59/131* (2023.02); *H10K 59/353* (2023.02)

(58) Field of Classification Search
CPC ........................... H10K 59/122; H10K 59/353
See application file for complete search history.

(56) References Cited

U.S. PATENT DOCUMENTS

2014/0346468 A1* 11/2014 Kim ..................... H10K 59/122
438/34
2016/0043150 A1 2/2016 Wang et al.
(Continued)

FOREIGN PATENT DOCUMENTS

CN 103311269 A 9/2013
CN 104299968 A 1/2015
(Continued)

*Primary Examiner* — Douglas M Menz
(74) *Attorney, Agent, or Firm* — Ling Wu; Stephen Yang; Ling and Yang Intellectual Property

(57) ABSTRACT

A display substrate includes a light emitting structure layer disposed on a base substrate, the light emitting structure layer includes a first electrode layer, a pixel definition layer, a light emitting functional layer and a second electrode layer; the first electrode layer includes multiple first electrodes; the pixel definition layer is disposed on a side of the first electrodes away from the base substrate, and is provided with multiple pixel openings and multiple flow channels; the pixel openings expose surfaces of the first electrodes away from the base substrate, each flow channel is located between two adjacent pixel openings in the first direction and communicates the two adjacent pixel openings in the first direction; the light emitting functional layer includes a first functional layer and a light emitting layer that are stacked; the first functional layer is disposed on surfaces of the first electrodes away from the base substrate.

18 Claims, 11 Drawing Sheets

(56)  References Cited

U.S. PATENT DOCUMENTS

| | | | |
|---|---|---|---|
| 2016/0351632 A1 | 12/2016 | Iguchi et al. | |
| 2016/0359112 A1 | 12/2016 | Wang et al. | |
| 2017/0194395 A1* | 7/2017 | Hu | H10K 71/135 |
| 2020/0243621 A1 | 7/2020 | Zhao | |
| 2021/0288120 A1* | 9/2021 | Zhao | H10K 59/353 |
| 2022/0392967 A1 | 12/2022 | Zhang | |
| 2023/0098247 A1 | 3/2023 | Cui | |
| 2023/0133156 A1 | 5/2023 | Hou et al. | |

FOREIGN PATENT DOCUMENTS

| | | | |
|---|---|---|---|
| CN | 104465671 A | 3/2015 |
| CN | 108807457 A | 11/2018 |
| CN | 111463353 A | 7/2020 |
| CN | 111599942 A | 8/2020 |
| CN | 111640772 A | 9/2020 |
| CN | 215578569 U | 1/2022 |
| KR | 10-2016-0067544 A | 6/2016 |
| WO | 2021174983 A1 | 9/2021 |

* cited by examiner

A-A

B-B

C-C

D-D

E-E

I-I

J-J

M-M

L-L

DISPLAY SUBSTRATE AND DISPLAY DEVICE

CROSS-REFERENCE TO RELATED APPLICATION

The present application is a U.S. National Phase Entry of International Application PCT/CN2022/102787 having an international filing date of Jun. 30, 2022, and entitled "Display Substrate and Display Device", the contents of the above-identified application should be construed as being hereby incorporated by reference in its entirety.

TECHNICAL FIELD

Embodiments of the present disclosure relate to, but are not limited to, the field of display technologies, and more particularly to a display substrate and a display device.

BACKGROUND

At present, organic light emitting diode (OLED) display products are gradually replacing liquid crystal display (LCD) products due to advantages such as wide color gamut, low power consumption and fast response speed. At present, in most OLED display products on the market, organic film layers of OLED devices are made by evaporation technology, which has some shortcomings, such as a low material utilization rate and a high production cost. Therefore, many enterprises and research institutions have turned their attention to development of ink jet printing OLED technology.

Ink jet printing is a technology that uses solution method to prepare an OLED material into ink, ejects the ink into a pixel opening of a specified sub-pixel through a nozzle, and then dries it to form a film. Compared with the evaporation technology, the ink jet printing technology not only reduces material waste, but also reduces use of MASK plates (MASK) and a cost of maintaining a high vacuum environment in the evaporation technology, and the like. However, in an actual printing process, ink droplets will shift in angle and drip into adjacent sub-pixels by mistake because of an accuracy of the nozzle and a problem of ink materials, resulting in differences between ink volumes in different sub-pixels, and a problem of uneven film thickness after final drying and film formation. For example, in the manufacturing of a hole injection layer (HIL), being limited by the ink, a phenomenon of deviation of ink droplets is more obvious, which will lead to obvious bright and dark lines in a display device ultimately manufactured and affect a performance of the display device.

SUMMARY

The following is a summary of subject matter described herein in detail. The summary is not intended to limit the protection scope of claims.

An embodiment of the present disclosure provides a display substrate, which includes a display area and a non-display area on a periphery of the display area;

the display area includes a driving structure layer and a light emitting structure layer stacked sequentially on a base substrate, wherein the light emitting structure layer includes a first electrode layer, a pixel definition layer, a light emitting functional layer, and a second electrode layer; the first electrode layer includes multiple first electrodes disposed on a side of the driving structure layer away from the base substrate;

the pixel definition layer is disposed on a side of the multiple first electrodes away from the base substrate, and is provided with multiple pixel openings and multiple flow channels; each pixel opening exposes a surface of a first electrode away from the base substrate, each flow channel is located between two adjacent pixel openings in a first direction and communicates the two adjacent pixel openings in the first direction;

the light emitting functional layer includes a first functional layer and a light emitting layer stacked sequentially along a direction away from the base substrate; the first functional layer is disposed on surfaces of the multiple first electrodes away from the base substrate, the first functional layer includes one film layer or more film layers, at least one film layer of the first functional layer is located in the multiple pixel openings and the multiple flow channels; the light emitting layer is disposed on a surface of the first functional layer away from the base substrate and is located in the pixel openings;

the second electrode layer is disposed on a surface of the light emitting functional layer away from the base substrate, and the first electrodes, the light emitting functional layer, and the second electrode layer are sequentially stacked to form light emitting devices.

An embodiment of the present disclosure further provides a display device including the display substrate described above.

Other aspects may be understood upon reading and understanding of the drawings and the detailed description.

BRIEF DESCRIPTION OF DRAWINGS

Accompanying drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

FIG. 4b is a schematic diagram of a cross-sectional structure taken along B-B in FIG. 4a.

FIG. 4c is a schematic diagram of a cross-sectional structure taken along C-C in FIG. 4a.

FIG. 5b is a schematic diagram of a cross-sectional structure taken along D-D in FIG. 5a.

DETAILED DESCRIPTION

Those of ordinary skills in the art should understand that modifications or equivalent replacements may be made to the technical solutions of the embodiments of the present disclosure without departing from the spirit and scope of the technical solutions of the embodiments of the present disclosure, and should all fall in the scope of the claims of the present disclosure.

Figure 1:
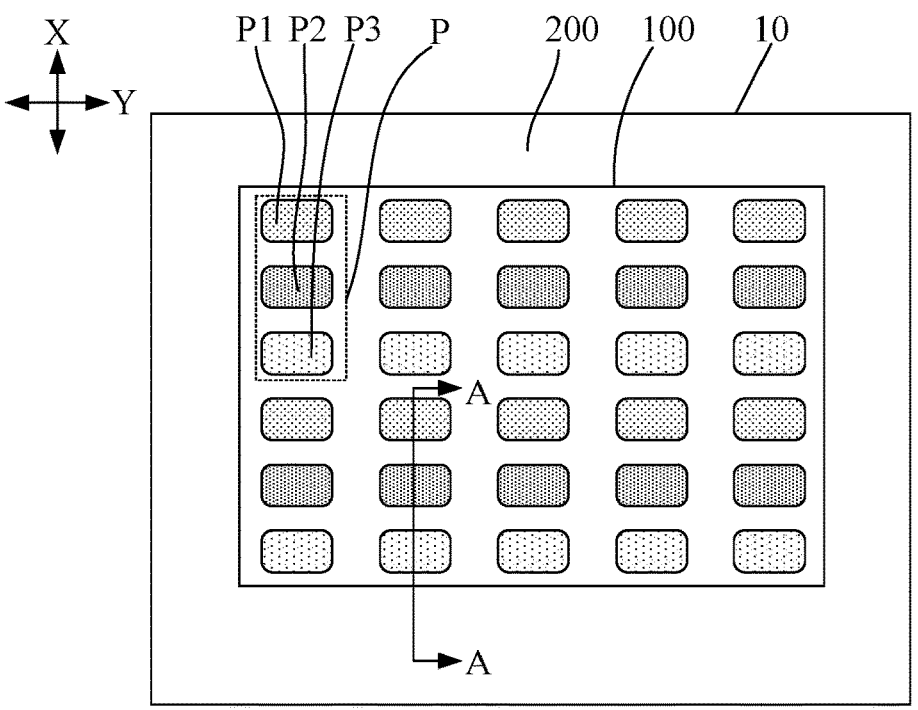
FIG. 1 is a schematic diagram of a structure of a pixel arrangement of a display substrate of some exemplary embodiments.

As shown in FIG. 1, FIG. 1 is a schematic diagram of a structure of a pixel arrangement of a display substrate of some exemplary embodiments, the display substrate includes a display area 100 and a non-display area 200 located on a periphery of the display area 100. The display area 100 includes multiple pixel units P arranged in an array on a base substrate 10. The pixel units P include multiple sub-pixels arranged sequentially along a first direction X (which may be referred to as a column direction), and multiple sub-pixels located in a same row in a second direction Y (which may be referred to as a row direction) may emit light of a same color, and the first direction X intersects with the second direction Y. Exemplarily, each pixel unit P may include three sub-pixels arranged side by side along the first direction X, which are respectively a first sub-pixel P1 emitting a first color light (e.g. red light), a second sub-pixel P2 emitting a second color light (e.g. green light), and a third sub-pixel P3 emitting a third color light (e.g. blue light). Multiple pixel units P are sequentially arranged in the first direction X, and multiple sub-pixels located in a same row in the second direction Y may emit light of a same color. Exemplarily, the first direction X and the second direction Y may perpendicularly intersect. An area represented by each sub-pixel in FIG. 1 is a light emitting area or a pixel opening area of each sub-pixel. The arrangement of pixels of the display substrate and the types and numbers of sub-pixels contained in each pixel unit are not limited in the embodiments of the present disclosure.

Figure 2:
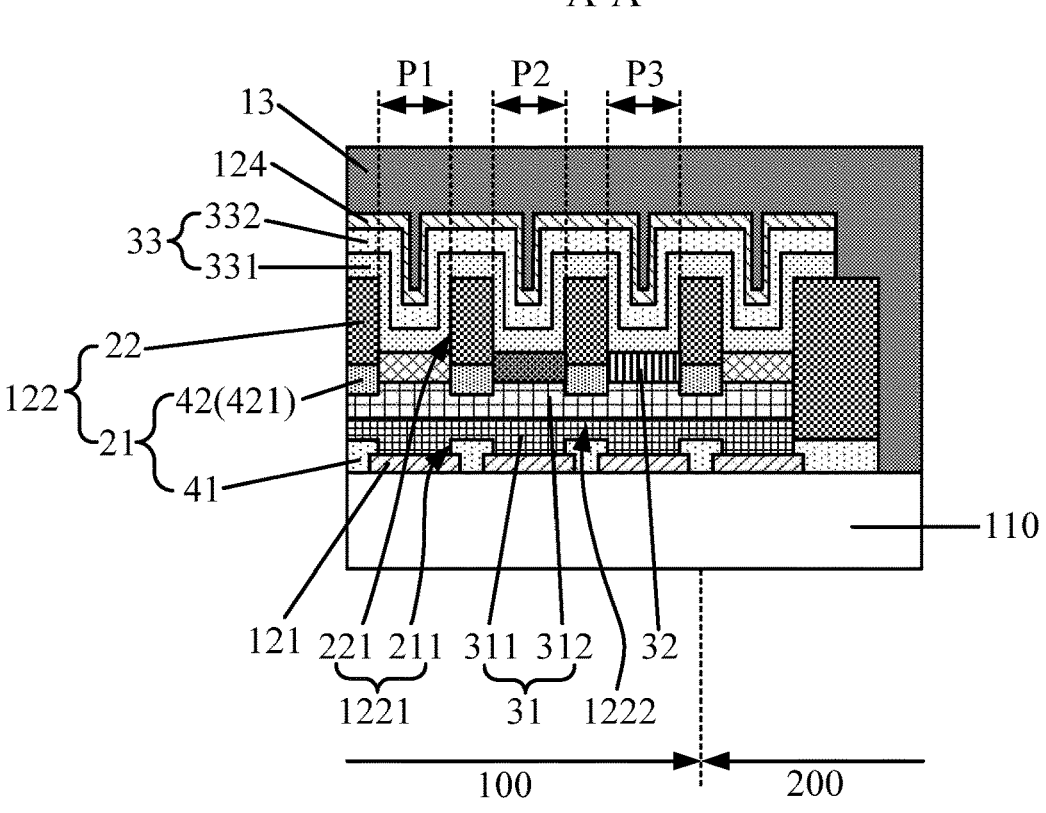
FIG. 2 is a schematic diagram of a cross-sectional structure taken along A-A in FIG. 1 in some exemplary embodiments.
Figure 3:
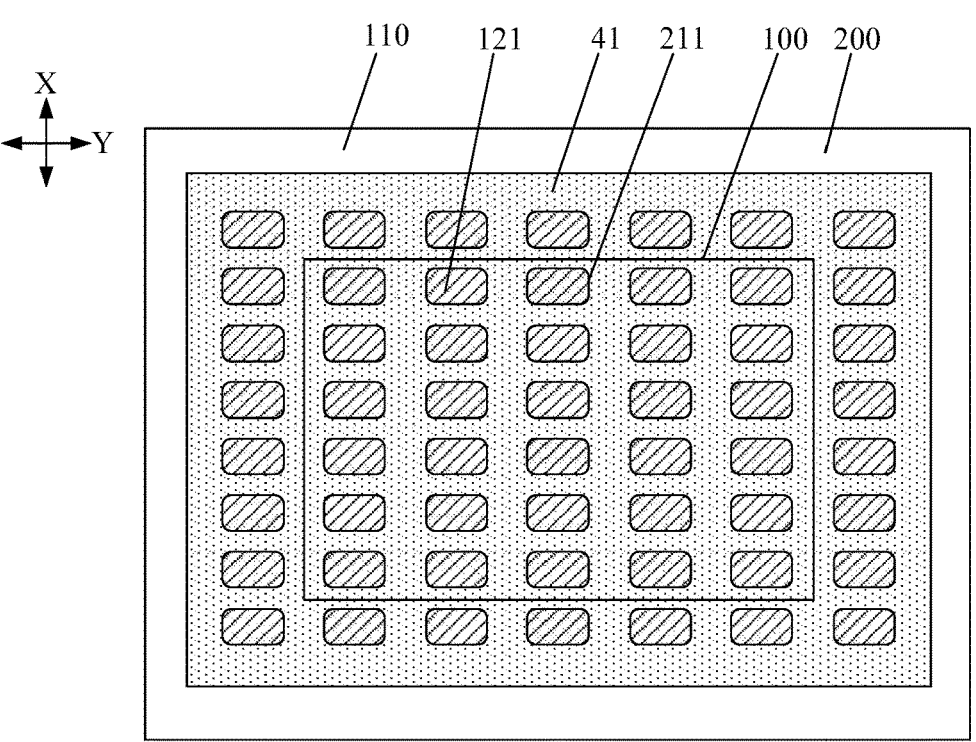
FIG. 3 is a schematic diagram of a planar structure after first electrodes and a first sublayer of a first pixel definition layer are formed on a driving backplane in some exemplary embodiments.

An embodiment of the present disclosure provides a display substrate, in some exemplary embodiments, as shown in FIG. 2, FIG. 2 is a schematic diagram of a cross-sectional structure taken along A-A in FIG. 1 in some exemplary embodiments, and the display substrate includes a display area 100 and a non-display area 200 located on a periphery of the display area 100. The display area 100 includes a driving structure layer and a light emitting structure layer stacked sequentially on a base substrate, and the light emitting structure layer includes a first electrode layer, a pixel definition layer 122, a light emitting functional layer and a second electrode layer 124. An entirety of the base substrate and the driving structure layer disposed on the base substrate may be referred to as a driving backplate 110.

The first electrode layer includes multiple first electrodes 121 disposed on a side of the driving structure layer away from the base substrate.

The pixel definition layer 122 is disposed on a side of the multiple first electrodes 121 away from the base substrate, and is provided with multiple pixel openings 1221 and multiple flow channels 1222. Each pixel opening 1221 exposes a surface of a first electrode 121 away from the base substrate, each flow channel 1222 is located between two adjacent pixel openings 1221 in the first direction X, and communicates the two adjacent pixel openings 1221 in the first direction X.

The light emitting functional layer includes a first functional layer 31 and a light emitting layer 32 stacked sequentially in a direction away from the base substrate. The first functional layer 31 is disposed on surfaces of the multiple first electrodes 121 away from the base substrate, the first functional layer 31 includes one film layer or more film layers, and at least one film layer of the first functional layer 31 is located in the multiple pixel openings 1221 and the multiple flow channels 1222. The light emitting layer 32 is disposed on a surface of the first functional layer 31 away from the base substrate and located in the pixel openings 1221.

The second electrode layer 124 is disposed on a surface of the light emitting functional layer away from the base substrate, and the first electrodes 121, the light emitting functional layer, and the second electrode layer 124 are sequentially stacked to form light emitting devices.

In the display substrate of the embodiment of the present disclosure, the pixel definition layer 122 is provided with multiple flow channels 1222, and each flow channel 1222 is located between two adjacent pixel openings 1221 in the first direction X, and the flow channel 1222 communicates the two adjacent pixel openings 1221 in the first direction X. Thus, when one film layer or more film layers of the first functional layer 31 is (are) formed by an ink jet printing process, ink forming the first functional layer 31 may flow between the multiple pixel openings 1221 located in the first direction X through the multiple flow channels 1222, so that differences between ink volumes of the first functional layer 31 in the multiple pixel openings 1221 in the first direction X are small. After the ink of the first functional layer 31 is dried to form a film, furthermore, thicknesses of the film layers of the first functional layer 31 formed in the different pixel openings 1221 may be made relatively uniform. The differences between the ink volumes of the first functional layer 31 in the different pixel openings 1221 because of deviation of the ink droplets of the first functional layer 31 in the first direction X may thus be reduced, furthermore, the differences between the thicknesses of the film layers of the first functional layer 31 formed in different pixel openings 1221 may be reduced to improve a display effect. In addition, it is beneficial to design the pixel openings 1221 to be smaller, so as to realize the manufacturing of a higher resolution display substrate.

In the display substrate of the embodiment of the present disclosure, at least one film layer of the first functional layer 31 is located in the multiple pixel openings 1221 and the multiple flow channels 1222, in this way, in some implementations, the first functional layer 31 may block the multiple flow channels 1222, for example, the first functional layer 31 may be filled in the multiple flow channels 1222. In this way, when the light emitting layer 32 is subsequently formed by an ink jet printing process, ink of the light emitting layer 32 may be prevented from flowing between the multiple pixel openings 1221 in the first direction X through the multiple flow channels 1222, furthermore, in some exemplary embodiments, cross-color between different sub-pixels in the first direction X may be avoided.

In some exemplary embodiments, the base substrate may be a transparent rigid substrate or a flexible substrate, for example, the material of the base substrate may be glass, quartz, plastic, transparent metal, or the like.

The driving structure layer may include multiple pixel driving circuits. Each pixel driving circuit may include multiple thin film transistors (T) and a storage capacitor (C), and the pixel driving circuit may have a structure of 3T1C, 4T1C, 5T1C, 5T2C, 6T1C, 7T1C, etc., which is not limited in the embodiments of the present disclosure. The driving structure layer may further include multiple data lines and multiple gate lines, as well as other signal lines. The first electrodes 121 are connected to the pixel driving circuits, and the pixel driving circuit drives a corresponding one of the light emitting devices to emit light. The light emitting devices may be OLED devices of a bottom emission type or a top emission type. A first electrode 121 may be an anode of a light emitting device, when the light emitting device is a bottom emission OLED device, the anode is a transparent anode, and when the light emitting device is a top emission OLED device, the anode is a reflective anode. The second electrode layer 124 may be a cathode of the light emitting device.

In some exemplary embodiments, as shown in FIG. 2, at least one film layer of the first functional layer 31 includes multiple first extension portions extending along the first direction X, the first extension portions have an integral structure and located in the multiple pixel openings 1221 and in the multiple flow channels 1222 in the first direction X.

In some exemplary embodiments, the pixel definition layer may be in a single layer structure, or the pixel definition layer may be in a multi-layer structure.

In some exemplary embodiments, as shown in FIG. 2, the pixel definition layer 122 may include a first pixel definition layer 21 and a second pixel definition layer 22. The first pixel definition layer 21 is disposed on a side of the multiple first electrodes 121 away from the base substrate, and the first pixel definition layer 21 is provided with multiple first pixel openings 211 and the multiple flow channels 1222. The first pixel openings 211 exposes surfaces of the first electrodes 121 away from the base substrate, and each flow channel 1222 is located between two adjacent first pixel openings 211 in a first direction X. The second pixel definition layer 22 is disposed on a side of the first pixel definition layer 21 away from the base substrate, and the second pixel definition layer 22 is provided with multiple second pixel openings 221. Positions of the second pixel openings 221 correspond to positions of the first pixel openings 211, and the second pixel openings 221 and the first pixel openings 211 jointly form the pixel openings 1221, and the multiple second pixel openings 221 expose two ports of each of the multiple flow channels 1222.

Figure 4A:
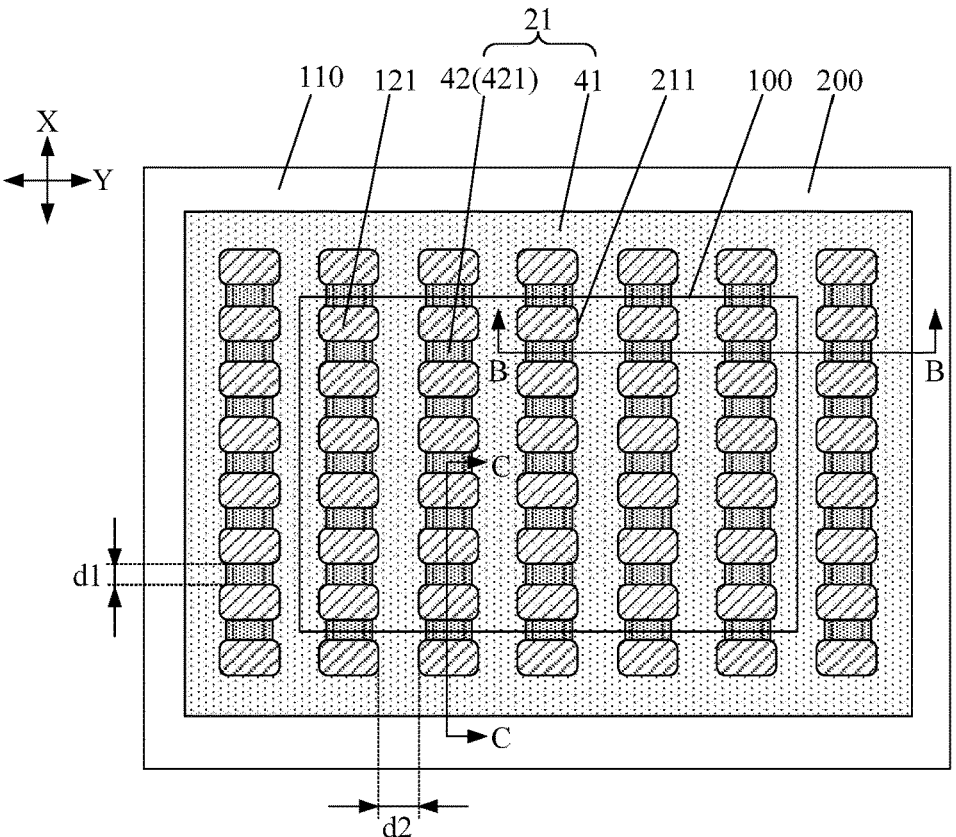
FIG. 4a is a schematic diagram of a planar structure after a second sublayer of a first pixel definition layer is formed in some exemplary embodiments.
Figure 4B:
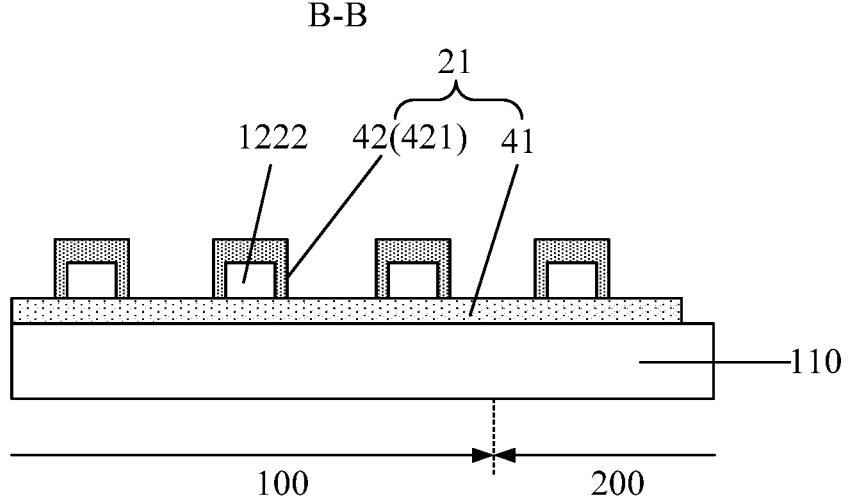
Figure 4C:
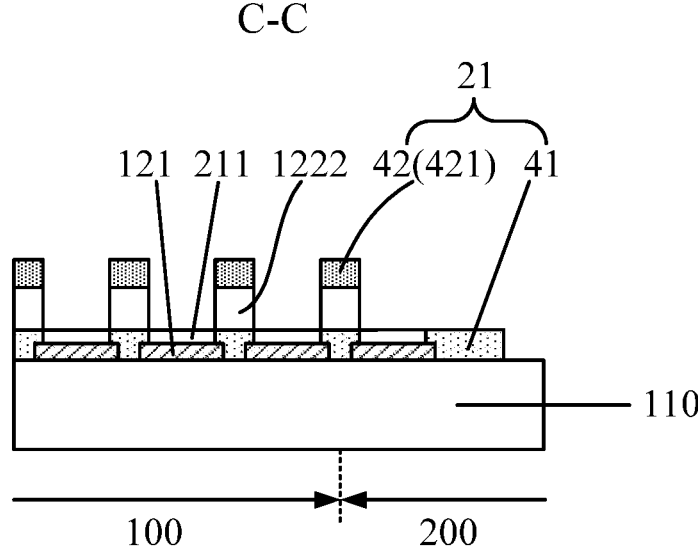

In an example of this embodiment, as shown in FIG. 3, FIG. 4a, FIG. 4b and FIG. 4c, FIG. 3 is a schematic diagram of a planar structure after first electrodes and a first sublayer of a first pixel definition layer are formed on a driving backplane in some exemplary embodiments, FIG. 4a is a schematic diagram of a planar structure after a second sublayer of a first pixel definition layer is formed in some exemplary embodiments, FIG. 4b is a schematic diagram of a cross-sectional structure taken along B-B in FIG. 4a, FIG. 4c is a schematic diagram of a cross-sectional structure taken along C-C in FIG. 4a. The first pixel definition layer 21 includes a first sublayer 41 and a second sublayer 42. The first sublayer 41 is disposed on a side of the multiple first electrodes 121 away from the base substrate and is provided with the multiple first pixel openings 211. The second sublayer 42 is disposed on a surface of the first sublayer 41 away from the base substrate, and the second sublayer 42 includes multiple connection portions 421, and each connection portion 421 is provided with a flow channel 1222 and located between two adjacent first pixel openings 211 in the first direction X.

Figure 5A:
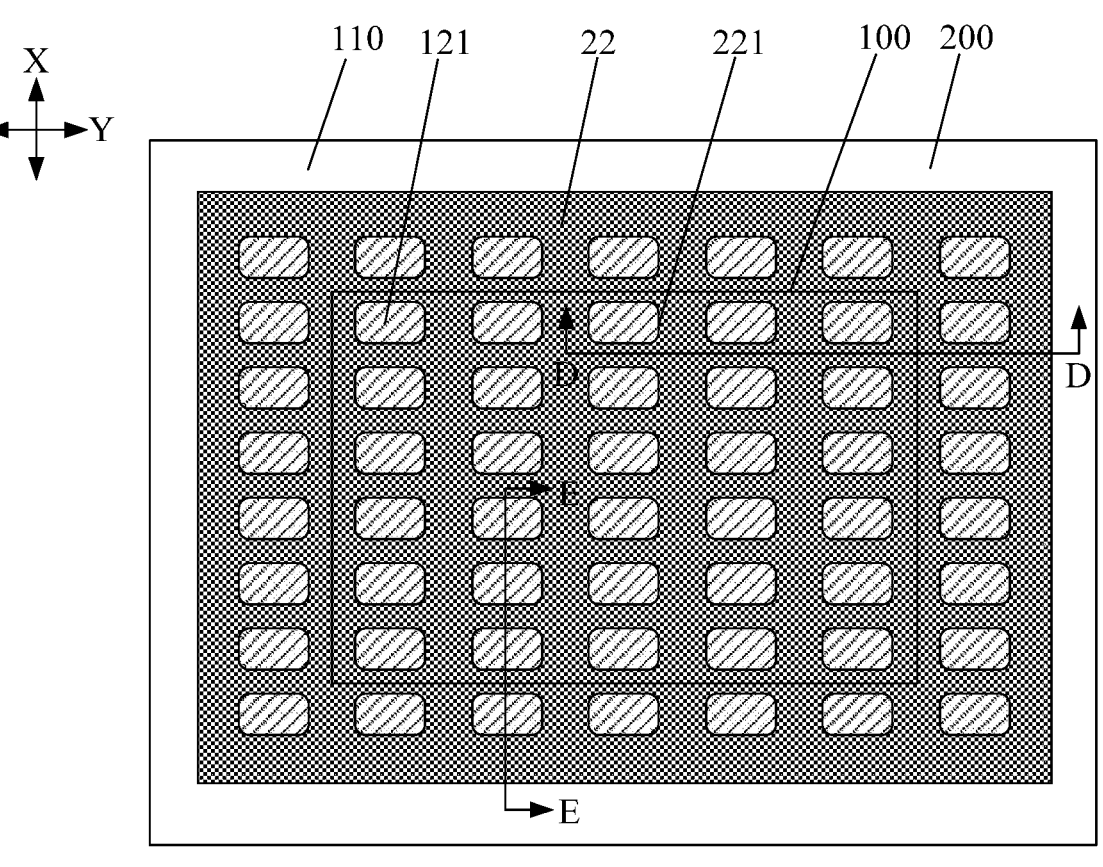
FIG. 5a is a schematic diagram of a planar structure after a second pixel definition layer is formed in some exemplary embodiments.
Figure 5B:
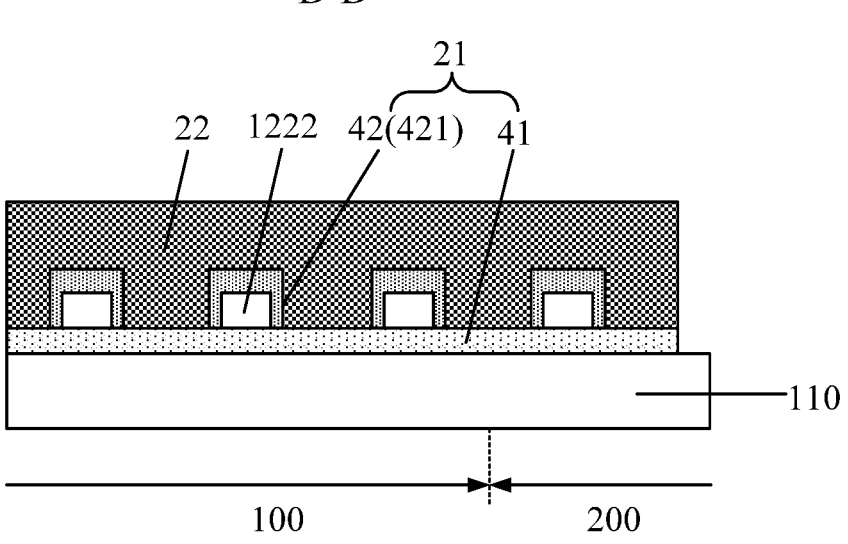
Figure 5C:
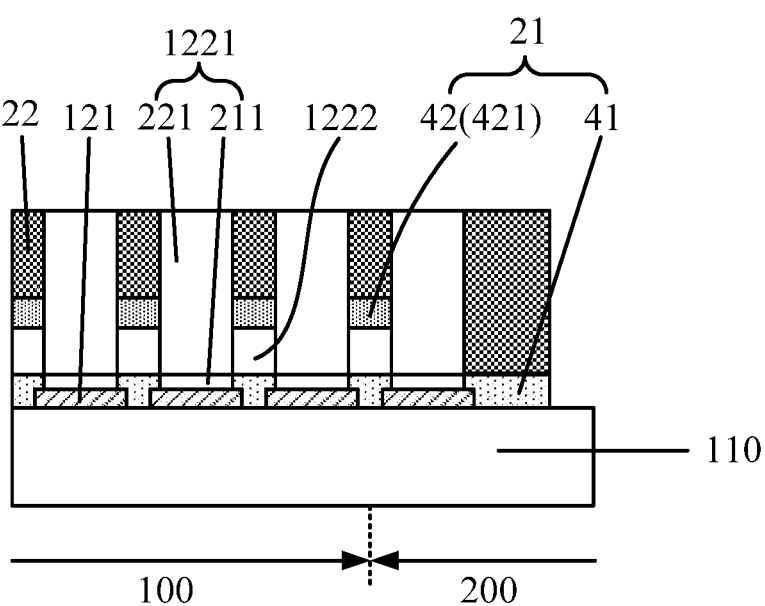
FIG. 5*c* is a schematic diagram of a cross-sectional structure taken along E-E in FIG. 5*a*.

The second pixel definition layer 22 may be a single layer structure. As shown in FIG. 5a, FIG. 5b and FIG. 5c, FIG. 5a is a schematic diagram of a planar structure after a second pixel definition layer is formed in some exemplary embodiments, FIG. 5b is a schematic diagram of a cross-sectional structure taken along D-D in FIG. 5a, FIG. 5c is a schematic diagram of a cross-sectional structure taken along E-E in FIG. 5a. The second pixel definition layer 22 is disposed on a side of the first sublayer 41 and the multiple connection portions 421 away from the base substrate, and the second pixel definition layer 22 is provided with multiple second pixel openings 221. Positions of the second pixel openings 221 and positions of the first pixel openings 211 correspond to each other, and the second pixel openings 221 and the first pixel openings 211 jointly form pixel openings 1221, and the multiple second pixel openings 221 expose two ports of each of the multiple flow channels 1222. In this way, each flow channel 1222 is located between two adjacent pixel openings 1221 in the first direction X and communicates the two adjacent pixel openings 1221 in the first direction X.

In some implementations of this example, after the first pixel definition layer 21 and the second pixel definition layer 22 are formed, multiple film layers of the first functional layer 31 may be formed using an ink jet printing process. Exemplarily, as shown in FIG. 2, the first functional layer 31 may include a hole injection layer 311 and a hole transport layer 312 sequentially stacked in a direction away from the substrate. The hole injection layer 311 and the hole transport layer 312 may both be formed using an ink jet printing process, the hole injection layer 311 and the hole transport layer 312 may both be located in the multiple pixel openings 1221 and in the multiple flow channels 1222, and the hole injection layer 311 and the hole transport layer 312 may block the multiple flow channels 1222. For example, the hole injection layer 311 and the hole transport layer 312 may be filled in the multiple flow channels 1222. Among them, a surface of the hole transport layer 312 located in the pixel openings 1221 away from the base substrate (i.e. a surface of the first functional layer 31 away from the base substrate) may be higher than a surface of the flow channels 1222 facing the base substrate. A surface of the hole transport layer 312 away from the base substrate may be lower or higher than a surface of the connection portions 421 away from the base substrate, and lower than a surface of the second pixel definition layer 22 away from the base substrate. Exemplarily, as shown in FIG. 2, the hole injection layer 311 and the hole transport layer 312 may each include multiple first extension portions extending in the first direction X, the first extension portions are in an integral structure and are located in the multiple pixel openings 1221 and the multiple flow channels 1222 in the first direction X. That is, the hole injection layer 311 of multiple sub-pixels in a same column in the first direction X may be connected into one piece, and the hole transport layer 312 of multiple sub-pixels in a same column in the first direction X may be connected into one piece. In other implementations, after the ink of the hole injection layer or/and the hole transport layer is dried and formed into a film(s), the formed hole injection layer or/and the hole transport layer may be disconnected between the pixel openings and the flow channels in the first direction X. That is, the hole injection layer of multiple sub-pixels of a same column in the first direction X may be disconnected, and the hole transport layer of multiple sub-pixels of a same column in the first direction X may be disconnected. In other implementations, the first functional layer 31 may include only one film layer, or the first functional layer 31 may include two or more film layers.

Exemplarily, as shown in FIG. 2, the light emitting layer 32 may be disposed on a surface of the hole transport layer 312 away from the base substrate and located in the pixel openings 1221. The light emitting layer 32 may be formed using an ink jet printing process or may be formed using an evaporation process.

In some implementations of this example, as shown in FIG. 4a and FIG. 5a, the pixel definition layer (the first pixel definition layer 21 and the second pixel definition layer 22) may extend to the non-display area 200, and a circumferential edge of the pixel definition layer is located in the non-display area 200. An orthographic projection of the first sublayer 41 on the base substrate may contain an orthographic projection of the multiple connection portions 421 on the base substrate, circumferential edges of the first sublayer 41 and the second pixel definition layer 22 may both be located in the non-display area 200, and shapes of the circumferential edges of the first sublayer 41 and the second pixel definition layer 22 may both be rectangular.

In some implementations of this example, the multiple pixel openings are arranged in multiple rows and multiple columns, multiple pixel openings arranged along the first direction X is one row of pixel openings, and the multiple pixel openings arranged along the second direction Y is one row of pixel openings, and the first direction X intersects with the second direction Y. A distance between two adjacent pixel openings in the first direction X is smaller than a distance between two adjacent pixel openings in the second direction Y.

Exemplarily, as shown in FIG. 4a and FIG. 5a, positions of the second pixel openings 221 of the second pixel definition layer 22 in FIG. 5a and positions of the first pixel openings 211 of the first pixel definition layer 21 in FIG. 4a correspond to each other and jointly form pixel openings 1221. Therefore, in this example, arrangement of the multiple first pixel openings 211 of the first pixel definition layer 21 is the arrangement of the multiple pixel openings.

As shown in FIG. 4a, the multiple first pixel openings 211 are arranged in multiple rows and multiple columns, multiple first pixel openings 211 arranged along the first direction X is a column of first pixel openings, multiple first pixel openings 211 arranged along the second direction Y is a row of first pixel openings, and the first direction X intersects with the second direction Y. A distance d1 between two adjacent first pixel openings 211 in the first direction X is smaller than a distance d2 between two adjacent first pixel openings 211 in the second direction Y. That is, a distance between two adjacent pixel openings in the first direction X is smaller than a distance between two adjacent pixel openings in the second direction Y.

Since the distance between two adjacent pixel openings in the first direction X is smaller than the distance between two adjacent pixel openings in the second direction Y, that is, the distance between two adjacent pixel openings in the first direction X is smaller, therefore, in some technologies, when a film layer of the first functional layer (such as a hole injection layer) is formed by an ink jet printing process, being limited by the accuracy of nozzles and a problem of ink material, ink droplets will have an angle deviation, which will easily to drip into adjacent pixel openings in the first direction X by mistake, resulting in differences between ink volumes in different sub-pixels, and a problem of uneven film thickness after final drying and film formation, which affects display effects. In an embodiment of the present disclosure, as shown in FIG. 2, the pixel definition layer 122 is provided with multiple flow channels 1222, and each flow channel 1222 is located between two adjacent pixel openings 1221 in the first direction X, and the flow channel 1222 communicates two adjacent pixel openings 1221 in the first direction X. Thus, when one film layer or more film layers of the first functional layer 31 is (are) formed by an ink jet printing process, the ink forming the first functional layer 31 may flow between multiple pixel openings located in the first direction X through the multiple flow channels 1222, so that the differences between ink volumes of the first functional layer 31 in the multiple pixel openings 1221 in the first direction X are smaller. After the ink of the first functional layer 31 is dried to form a film, furthermore, thicknesses of the film layers of the first functional layer 31 formed in the different pixel openings 1221 may be made more uniform, therefore, the differences between ink volumes of the first functional layer 31 in different pixel openings 1221 caused by the deviation of ink droplets of the first functional layer 31 in the first direction X may be reduced, and furthermore, differences between thicknesses of the film layers of the first functional layer 31 formed in different pixel openings 1221 may be reduced, thereby improving display effects.

In some implementations of this example, as shown in FIG. 2, the light emitting functional layer may further include a second functional layer 33 disposed between the light emitting layer 32 and the second electrode layer 124, and the second functional layer 33 may include an electron transport layer 331 and an electron injection layer 332 stacked sequentially in a direction away from the base substrate. The electron transport layer 331 and the electron injection layer 332 may be formed using an evaporation process. As shown in FIG. 2, the display substrate may further include an encapsulation structure layer 13 disposed on a side of the second electrode layer 124 away from the base substrate, the encapsulation structure layer 13 may be a thin film encapsulation layer, and the encapsulation structure layer 13 may include a first inorganic material layer, an organic material layer, and a second inorganic material layer stacked sequentially in a direction away from the base substrate. Materials of the first inorganic material layer and the second inorganic material layer may include any one or more of the following: silicon nitride, silicon oxide, and silicon oxynitride, and a material of the organic material layer may include resin.

In another example of this embodiment, as shown in FIG. 3, FIG. 4a, FIG. 4b and FIG. 4c, FIG. 3 is a schematic diagram of a planar structure after first electrodes 121 and a first sublayer 41 of a first pixel definition layer are formed on a driving backplane 110 in some exemplary embodiments, FIG. 4a is a schematic diagram of a planar structure after a second sublayer 42 of the first pixel definition layer is formed in some exemplary embodiments, FIG. 4b is a schematic diagram of a cross-sectional structure taken along B-B in FIG. 4a, FIG. 4c is a schematic diagram of a cross-sectional structure taken along C-C in FIG. 4a. The first pixel definition layer 21 includes a first sublayer 41 and a second sublayer 42. The first sublayer 41 is disposed on a side of multiple first electrodes 121 away from the base substrate and is provided with multiple first pixel openings 211. The second sublayer 42 is disposed on a surface of the first sublayer 41 away from the base substrate, the second sublayer 42 includes multiple connection portions 421, and each connection portion is provided with a flow channel 1222 and located between two adjacent first pixel openings 211 in the first direction X.

Figure 6:
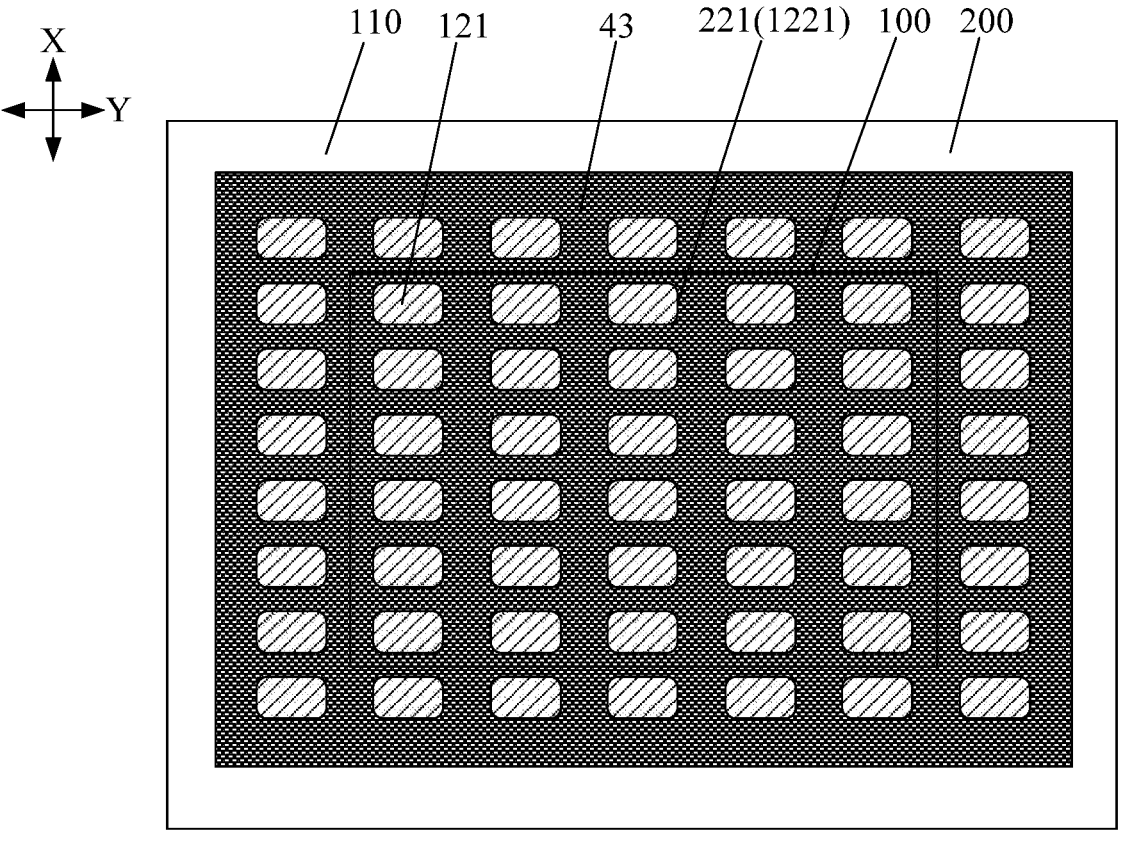
FIG. 6 is a schematic diagram of a planar structure after a third sublayer of a second pixel definition layer is formed in some exemplary embodiments.
Figure 7:
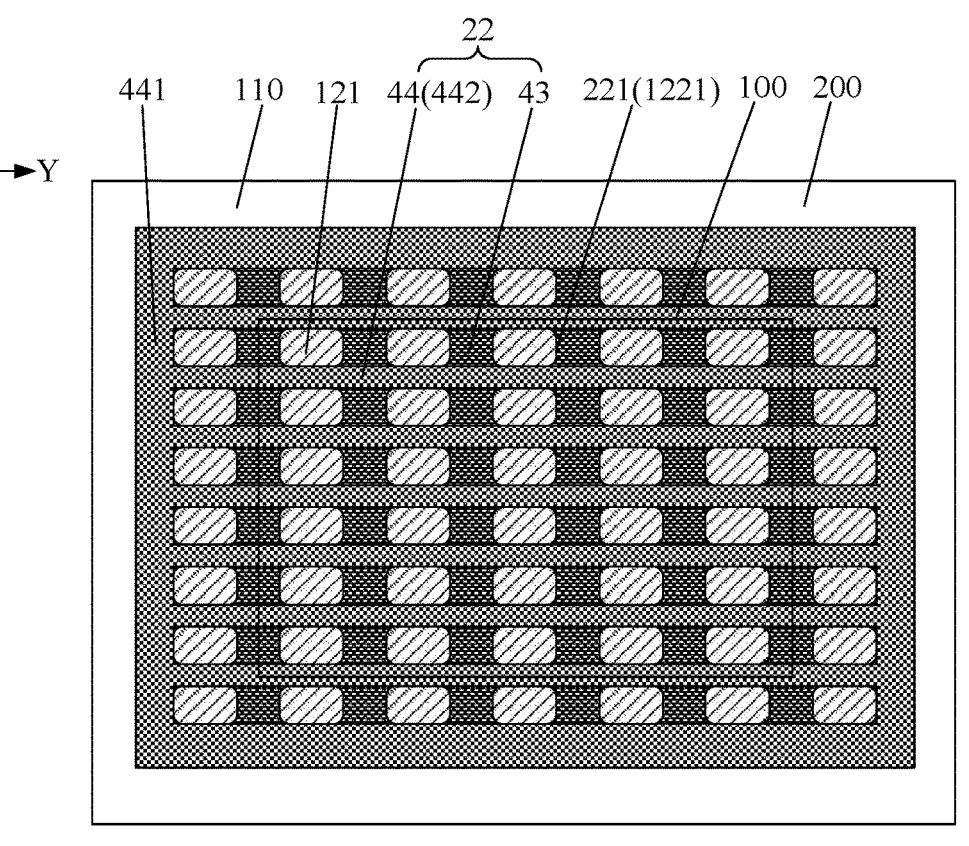
FIG. 7 is a schematic diagram of a planar structure after a fourth sublayer of a second pixel definition layer is formed in some exemplary embodiments.

The second pixel definition layer may be in a multi-layer structure. As shown in FIG. 6 and FIG. 7, FIG. 6 is a schematic diagram of a planar structure after a third sublayer 43 of a second pixel definition layer is formed in some exemplary embodiments, and FIG. 7 is a schematic diagram of a planar structure after a fourth sublayer 44 of the second pixel definition layer is formed in some exemplary embodiments, and the second pixel definition layer 22 may include a third sublayer 43 and a fourth sublayer 44. The third sublayer 43 is disposed on a side of the first sublayer 41 and the multiple connection portions 421 away from the base substrate, and is provided with multiple second pixel openings 221. Positions of the second pixel openings 221 and positions of first pixel openings 211 correspond to each other, and the second pixel openings 221 and the first pixel openings 211 jointly form pixel openings 1221.

As shown in FIG. 7, the fourth sublayer 44 is disposed on a side of the third sublayer 43 away from the base substrate, the fourth sublayer 44 includes multiple second banks 442 extending along the second direction Y, the second direction Y intersects with the first direction X, and the multiple second banks 442 are disposed at intervals in the first direction X. The multiple pixel openings 1221 are arranged in multiple rows and multiple columns, multiple pixel openings 1221 arranged along the first direction X is a column of pixel openings, multiple pixel openings 1221 arranged along the second direction Y is a row of pixel openings, and a row of pixel openings is disposed between two adjacent second banks 442. Among them, the third sublayer 43 and the fourth sublayer 44 expose two ports of each of the multiple flow channels so that each flow channel is located between two adjacent pixel openings 1221 in the first direction X and communicates the two adjacent pixel openings 1221 in the first direction X.

A surface of the first functional layer away from the base substrate is not higher than a surface of the third sublayer 43 away from the base substrate, and the light emitting layer is also disposed on the surface of the third sublayer 43 away from the base substrate.

In some implementations of this example, as shown in FIG. 7, after the formation of the first pixel definition layer 21 and the second pixel definition layer 22, multiple film layers of the first functional layer may be formed using an ink jet printing process. Exemplarily, the first functional layer may include a hole injection layer and a hole transport layer sequentially stacked in a direction away from the base substrate. The hole injection layer and the hole transport layer may both be formed by an ink jet printing process, the hole injection layer and the hole transport layer may both be located in the multiple pixel openings and the multiple flow channels, and the hole injection layer and the hole transport layer may block the multiple flow channels. For example, the hole injection layer and the hole transport layer may be filled in the multiple flow channels. Among them, a surface of the hole transport layer located in a pixel opening away from the base substrate (i.e. a surface of the first functional layer away from the base substrate) may be higher than a surface of a flow channel facing the base substrate. The surface of the hole transport layer away from the base substrate is not higher than the surface of the third sublayer 43 away from the base substrate, the light emitting layer may be disposed on the surface of the hole transport layer away from the base substrate and in the pixel opening 1221, and on a surface of the third sublayer 43 between two adjacent second banks 442 away from the base substrate. The light emitting layer may be formed by an ink jet printing process, a material of the light emitting layer in multiple pixel openings 1221 in a same row between the two adjacent second banks 442 may be the same, thus, the ink of the light emitting layer of multiple sub-pixels emitting light of a same color in a same row may flow between the multiple pixel openings 1221 in a same row between two adjacent second banks 442, which is conducive to improving a thickness uniformity of the light emitting layer of the multiple sub-pixels emitting light of a same color in a same row. Light emitting layers in the multiple pixel openings 1221 in a same row between two adjacent second banks 442 may be connected into an integral structure.

In some implementations of this example, as shown in FIG. 4a, FIG. 6 and FIG. 7, the pixel definition layer (the first pixel definition layer 21 and the second pixel definition layer 22) may extend to the non-display area 200, and a circumferential edge of the pixel definition layer is located in the non-display area 200. The fourth sublayer 44 may further include two first banks 441 located in the non-display area 200 and extending along the first direction X, two second banks 442 located in the non-display area 200 (two or more second banks 442 may be located in the non-display area 200), and the two second banks and the two first banks 441 form a circumferential edge of the fourth sublayer 44. Exemplarily, as shown in FIG. 4a, FIG. 6 and FIG. 7, circumferential edges of the first sublayer 41, the third sublayer 43, and the fourth sublayer 44 may all be located in the non-display area 200, and shapes of the circumferential edges of the first sublayer 41, the third sublayer 43, and the fourth sublayer 44 may all be rectangular.

In some implementations of this example, as shown in FIG. 7, a material of the third sublayer 43 may be a hydrophilic material, and a material of the fourth sublayer 44 may be a hydrophobic material. Thus, when the light emitting layer is formed by an ink jet printing process, it may facilitate the ink of the light emitting layer to flow between multiple pixel openings 1221 in a same row between two adjacent second banks 442, and the ink will not easily overflow by climbing along the second banks 442 of the fourth sublayer 44.

In some implementations of this example, as shown in FIG. 4a, materials of the first sublayer 41 and the second sublayer 42 may both be hydrophilic materials. Thus, when a film layer of the first functional layer is formed by an ink jet printing process, it may facilitate the ink of the first functional layer to flow between the multiple pixel openings in the first direction X, and a thickness uniformity of the first functional layer in the multiple pixel openings in the first direction X may be improved.

Figure 8:
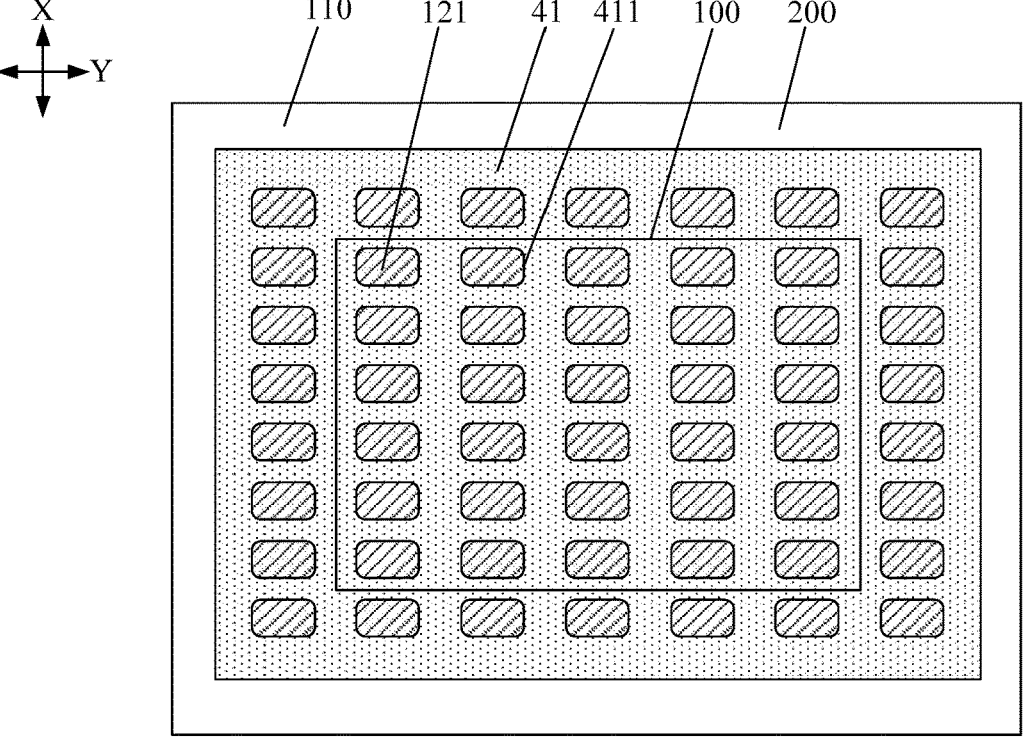
FIG. 8 is a schematic diagram of a planar structure after a first electrode and a first sublayer of a first pixel definition layer are formed on a driving backplane in some other exemplary embodiments.
Figure 9A:
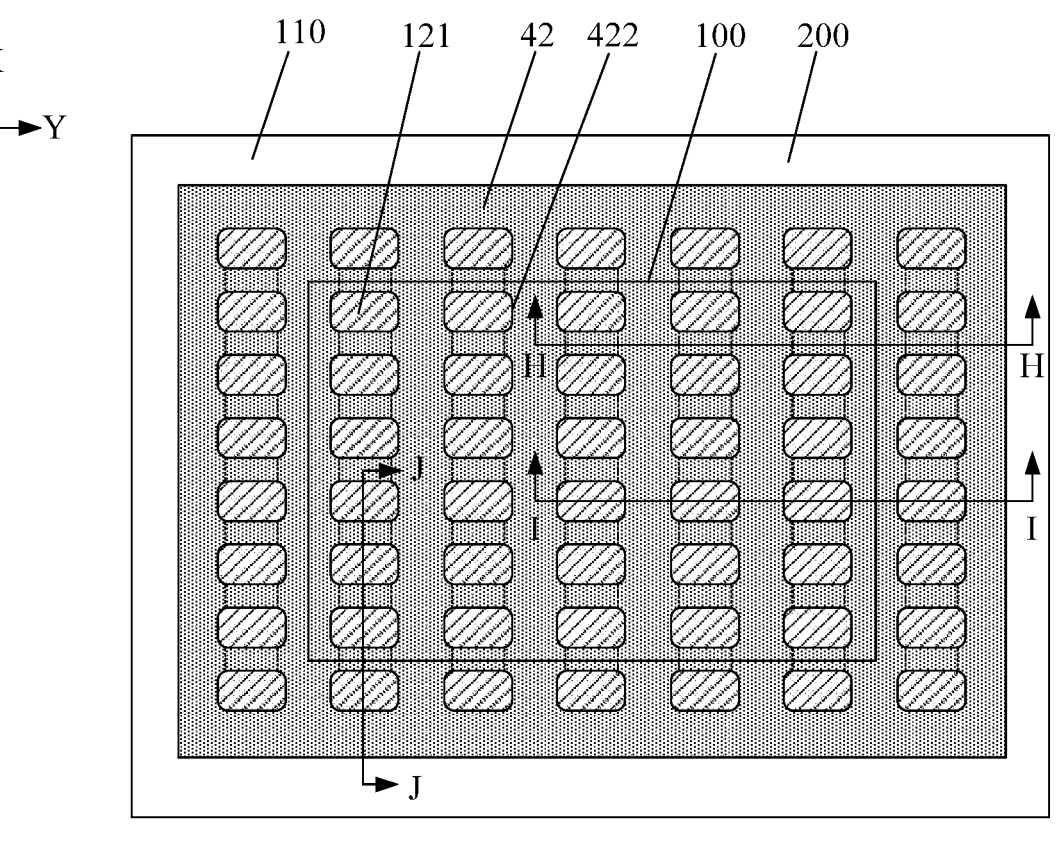
FIG. 9*a* is a schematic diagram of a planar structure after a second sublayer of a first pixel definition layer is formed in some other exemplary embodiments.
Figure 9B:
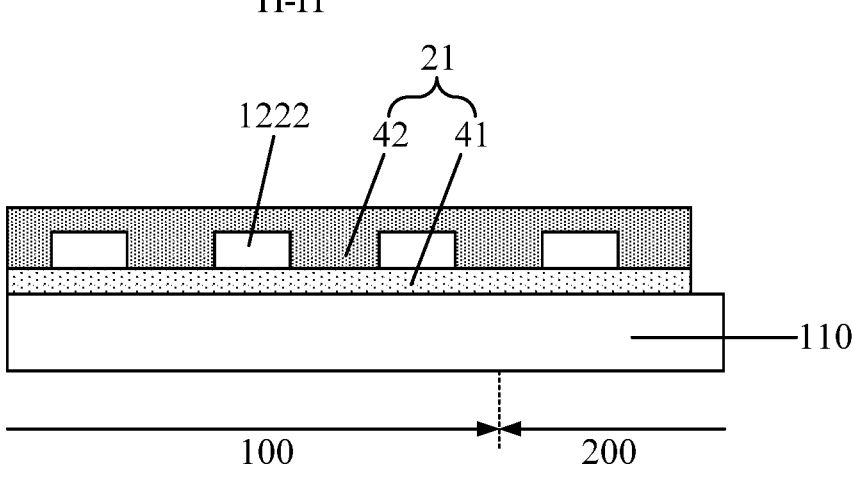
FIG. 9*b* is a schematic diagram of a cross-sectional structure taken along H-H in FIG. 9*a*.
Figure 9C:
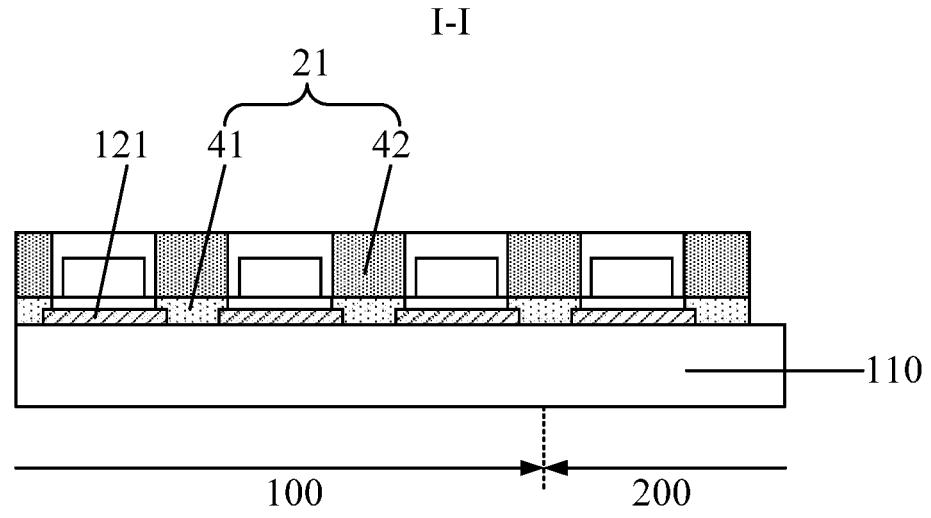
FIG. 9*c* is a schematic diagram of a cross-sectional structure taken along I-I in FIG. 9*a*.
Figure 9D:
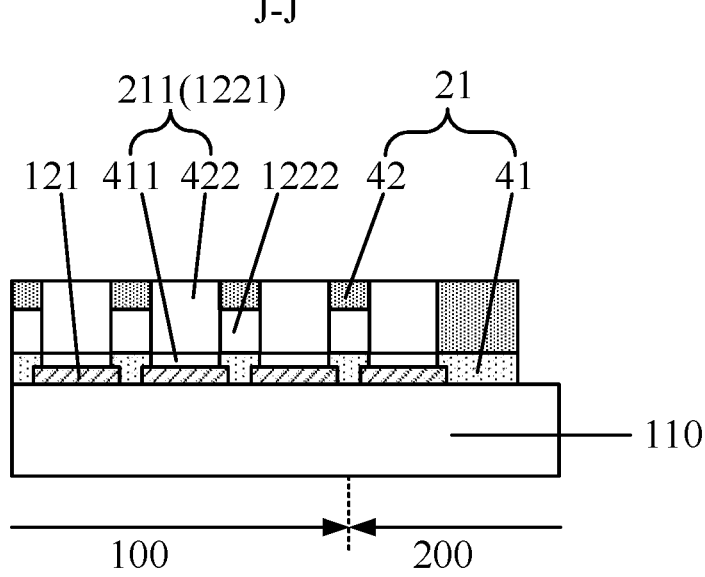
FIG. 9*d* is a schematic diagram of a cross-sectional structure taken along J-J in FIG. 9*a*.

In another example of this embodiment, as shown in FIG. 8, FIG. 9*a*, FIG. 9*b*, FIG. 9*c* and FIG. 9*d*, FIG. 8 is a schematic diagram of a planar structure after first electrodes and a first sublayer of a first pixel definition layer 41 are formed on a driving backplane in some other exemplary embodiments, FIG. 9*a* is a schematic diagram of a planar structure after a second sublayer 42 of the first pixel definition layer is formed in some other exemplary embodiments, FIG. 9*b* is a schematic diagram of a cross-sectional structure taken along H-H in FIG. 9*a*, FIG. 9*c* is a schematic diagram of a cross-sectional structure taken along I-I in FIG. 9*a*, FIG. 9*d* is a schematic diagram of a cross-sectional structure taken along J-J in FIG. 9*a*. The first pixel definition layer 21 may include a first sublayer 41 and a second sublayer 42. The first sublayer 41 is disposed on a side of multiple first electrodes 121 away from the base substrate and is provided with multiple first openings 411. The second sublayer 42 is disposed on a surface of the first sublayer 41 away from the base substrate, and is provided with multiple second openings 422 and multiple flow channels 1222. Positions of the second openings 442 and positions of the first openings 411 correspond to each other, and the second openings 442 and the first openings 411 jointly form the first pixel openings 211. Among them, each flow channel 1222 is located between two adjacent first pixel openings 211 in the first direction X and communicates the two adjacent first pixel openings 211 in the first direction X.

In this example, the first pixel definition layer 21 includes the first sublayer 41 and the second sublayer 42, i.e. the first pixel definition layer 21 may be in a multi-layer structure. In other implementations, the first pixel definition layer 21 of this embodiment may be in a single layer structure, i.e. the first sublayer 41 and the second sublayer 42 in this example may be taken as a whole as a film layer.

Figure 10A:
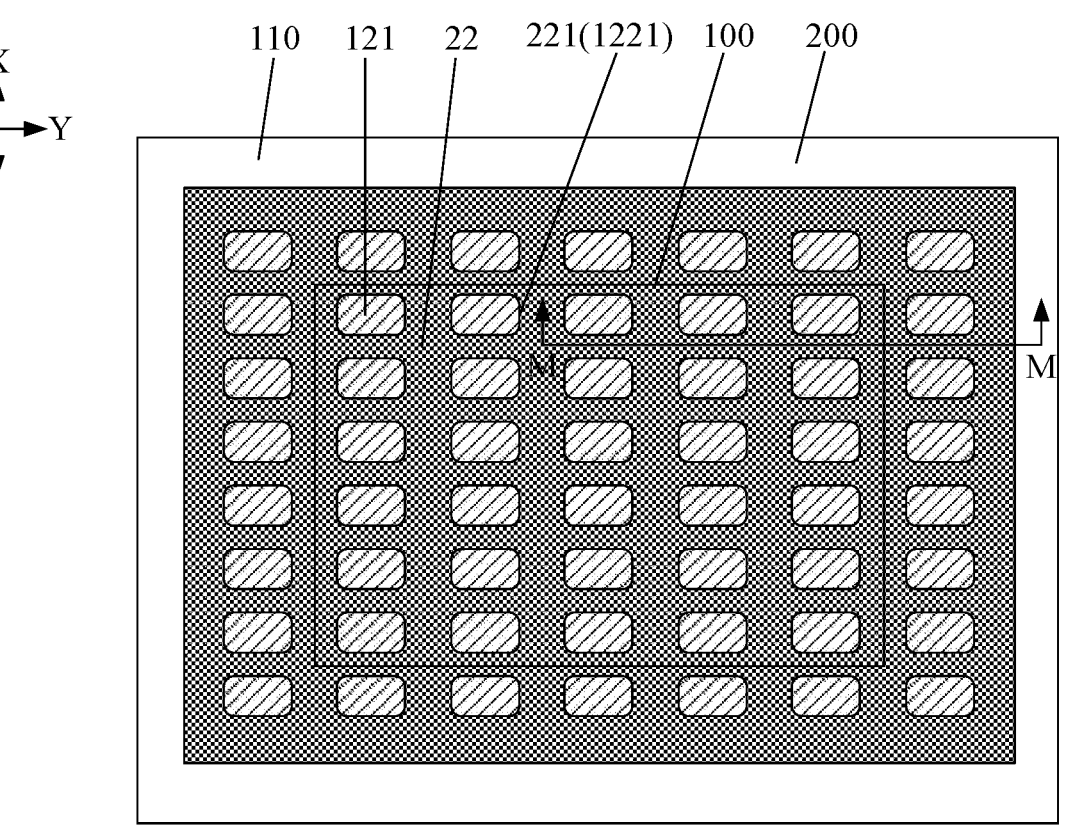
FIG. 10*a* is a schematic diagram of a planar structure after a second pixel definition layer is formed in some other exemplary embodiments.
Figure 10B:
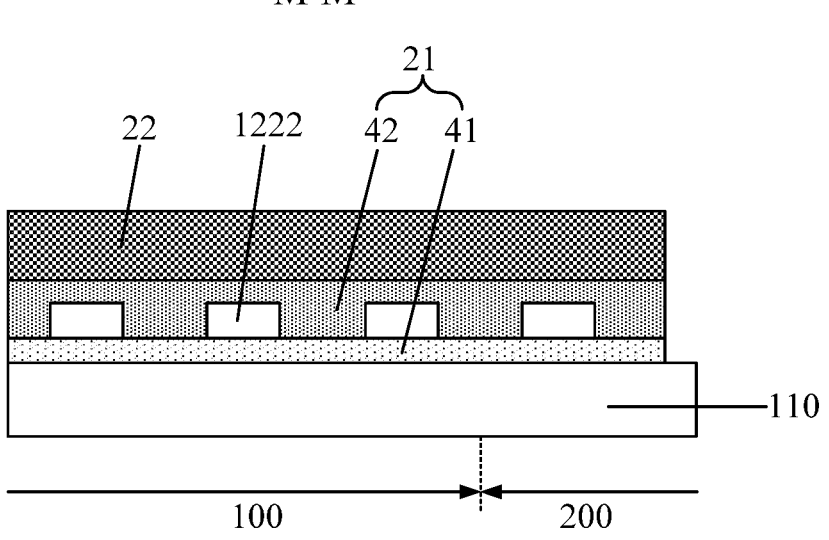
FIG. 10*b* is a schematic diagram of a cross-sectional structure taken along M-M in FIG. 10*a*.

In this example, as shown in FIG. 10*a* and FIG. 10*b*, FIG. 10*a* is a schematic diagram of a planar structure after a second pixel definition layer 22 is formed in some other exemplary embodiments, FIG. 10*b* is a schematic diagram of a cross-sectional structure taken along M-M in FIG. 10*a*, the second pixel definition layer 22 is disposed on a side of the first pixel definition layer 21 away from the base substrate, and is provided with multiple second pixel openings 221. Positions of the second pixel openings 221 and positions of the first pixel openings 211 correspond to each other, and the second pixel openings 221 and the first pixel openings 211 jointly form pixel openings 1221, and the multiple second pixel openings 221 expose two ports of each of the multiple flow channels 1222. Thus, each flow channel 1222 is located between two adjacent pixel openings 1221 in the first direction X and communicates the two adjacent pixel openings 1221 in the first direction X.

In some implementations of this example, as shown in FIG. 8 and FIG. 9*a*, a material of the first pixel definition layer 21 may be a hydrophilic material, for example, materials of the first sublayer 41 and the second sublayer 42 may be hydrophilic materials. As shown in FIG. 10*a*, a material of the second pixel definition layer 22 may be a hydrophobic material. Thus, when the film layer of the first functional layer is formed by an ink jet printing process, it may facilitate the ink of the first functional layer to flow between the multiple pixel openings 1221 in the first direction X, and a thickness uniformity of the first functional layer in the multiple pixel openings 1221 in the first direction X may be improved. When the light emitting layer is formed by an ink jet printing process, the ink of the light emitting layer will not easily climb along side walls of the second pixel openings 221, and overflow will not easily occur.

In some other exemplary embodiments, the pixel definition layer includes a first pixel definition layer and a second pixel definition layer.

The first pixel definition layer is disposed on a side of the multiple first electrodes away from the base substrate, and is provided with the multiple pixel openings and the multiple flow channels. Exemplarily, as shown in FIG. 8, FIG. 9*a*, FIG. 9*b*, FIG. 9*c* and FIG. 9*d*, the first pixel definition layer 21 may include a first sublayer 41 and a second sublayer 42. The first sublayer 41 is disposed on a side of the multiple first electrodes 121 away from the base substrate and is provided with multiple first openings 411. The second sublayer 42 is disposed on a surface of the first sublayer 41 away from the base substrate and is provided with multiple second openings 422 and multiple flow channels. Positions of the second opening 422 and positions of the first opening 411 correspond to each other, and the second openings 442 and the first openings 411 jointly form the pixel openings 1221, and each flow channel 1222 is located between two adjacent pixel openings 1221 in the first direction X and communicate the two adjacent pixel openings 1221 in the first direction X.

In this embodiment, the first pixel definition layer 21 includes the first sublayer 41 and the second sublayer 42, i.e. the first pixel definition layer 21 may be in a multi-layer structure. In some other implementations, the first pixel definition layer 21 of this embodiment may be in a single layer structure, i.e. the first sublayer 41 and the second sublayer 42 of this embodiment may be taken as a whole as a film layer.

Figure 11A:
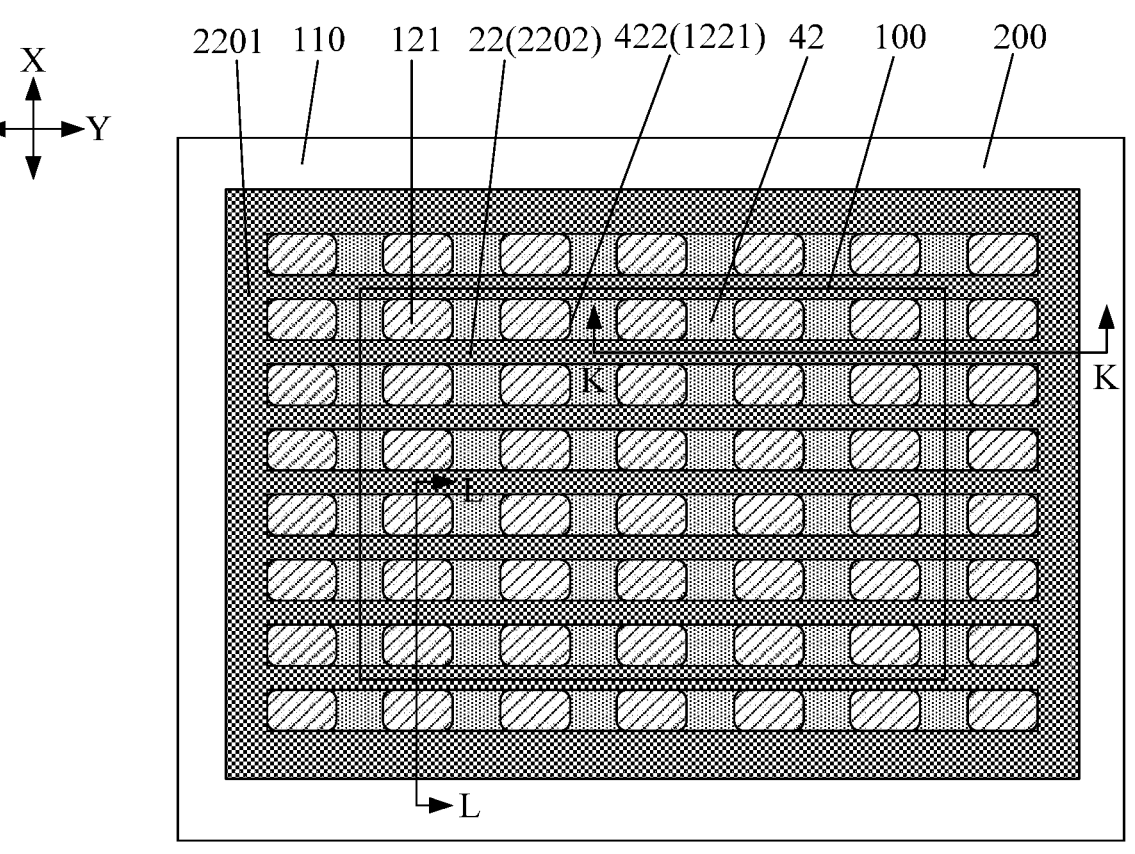
FIG. 11*a* is a schematic diagram of a planar structure after a second pixel definition layer is formed in some further exemplary embodiments.
Figure 11B:
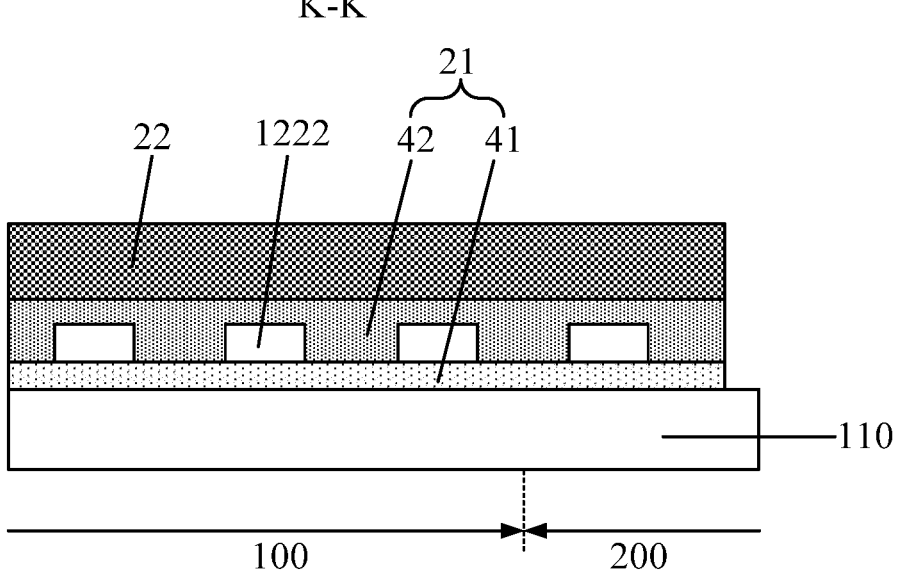
FIG. 11*b* is a schematic diagram of a cross-sectional structure taken along K-K in FIG. 11*a*.
Figure 11C:
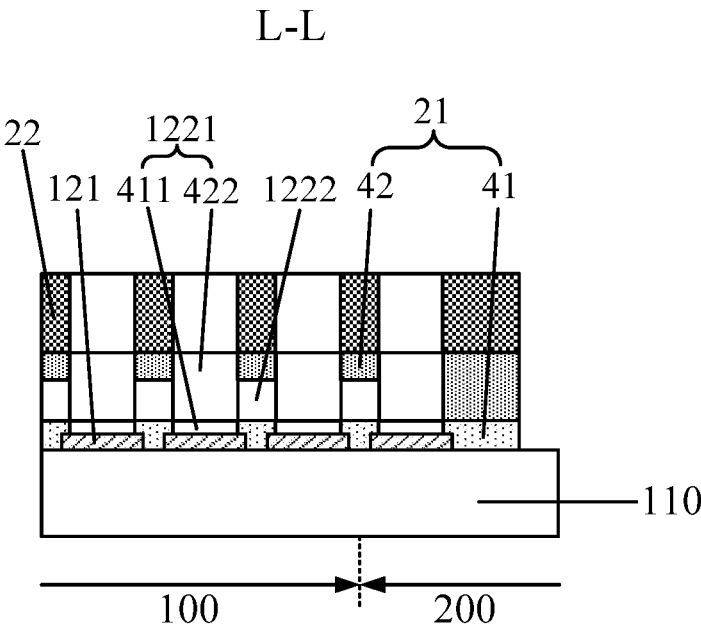
FIG. 11*c* is a schematic diagram of a cross-sectional structure taken along L-L in FIG. 11*a*.

As shown in FIG. 11*a*, FIG. 11*b* and FIG. 11*c*, FIG. 11*a* is a schematic diagram of a planar structure after a second pixel definition layer 22 is formed in some other exemplary embodiments, FIG. 11*b* is a schematic diagram of a cross-sectional structure taken along K-K in FIG. 11*a*, FIG. 11*c* is a schematic diagram of a cross-sectional structure taken along L-L in FIG. 11*a*, the second pixel definition layer 22 is disposed on a side of the first pixel definition layer 21 away from the base substrate. The second pixel definition layer 22 includes multiple second banks 2202 extending along the second direction Y, and the second direction intersects with the first direction X. The multiple second banks 2202 are disposed at intervals in the first direction X, the second pixel definition layer 22 exposes two ports of each of the multiple flow channels 1222. The multiple pixel openings 1221 are disposed in multiple rows and multiple columns, multiple pixel openings 1221 disposed along the first direction X is a column of pixel openings, multiple pixel openings 1221 disposed along the second direction Y is a row of pixel openings, and a row of pixel openings is disposed between two adjacent second banks 2202.

A surface of the first functional layer away from the base substrate is not higher than a surface of the first pixel definition layer 21 away from the base substrate (i.e. a surface of the second sublayer 42 away from the base substrate in this example), the light emitting layer is also disposed on the surface of the first pixel definition layer 21 away from the base substrate (i.e. the surface of the second sublayer 42 away from the base substrate in this example).

In some examples of this embodiment, the pixel definition layer (the first pixel definition layer 21 and the second pixel definition layer 22) may extend to the non-display area 200, and a circumferential edge of the pixel definition layer is located in the non-display area 200. As shown in FIG. 11a, the second pixel definition layer 22 further includes two first banks 2201 extending along the first direction X in the non-display area 200, two second banks 2202 located in the non-display area 200 (two or more second banks 2202 may be located in the non-display area 200), and the two second banks 2202 and the two first banks 2201 form a circumferential edge of the second pixel definition layer 22. Exemplarily, as shown in FIG. 8, FIG. 9a, and FIG. 11a, circumferential edges of the first sublayer 41, the second sublayer 42, and the second pixel definition layer 22 may all be located in the non-display area 200, and shapes of the circumferential edges of the first sublayer 41, the second sublayer 42, and the second pixel definition layer 22 may all be rectangular.

In some examples of this embodiment, a material of the first pixel definition layer 21 may be a hydrophilic material, for example, as shown in FIG. 8 and FIG. 9a, materials of the first sublayer 41 and the second sublayer 42 may be hydrophilic materials. As shown in FIG. 11a, a material of the second pixel definition layer 22 may be a hydrophobic material. Thus, as shown in FIG. 11a, when a film layer of the first functional layer is formed by an ink jet printing process, it may facilitate the ink of the first functional layer to flow between the multiple pixel openings 1221 in the first direction X, and a thickness uniformity of the first functional layer in the multiple pixel openings 1221 in the first direction X may be improved. When the light emitting layer is formed by an ink jet printing process, it may facilitates the ink of the light emitting layer to flow between multiple pixel openings 1221 in a same row between two adjacent second banks 2202, and the ink will not easily overflow by climbing along a second bank 2202 of the second pixel definition layer 22.

An embodiment of the present disclosure further provides a display device, which includes the display substrate according to any one of the previous embodiments. The display device may be any product or component with a display function, such as a mobile phone, a tablet computer, a television, a display, a laptop computer, a digital photo frame, and a navigator.

In the accompanying drawings, a size of a constituent element, and a thickness of a layer or an area are sometimes exaggerated for clarity. Therefore, an implementation of the present disclosure is not necessarily limited to the size, and the shape and size of each component in the drawings do not reflect an actual scale. In addition, the drawings schematically illustrate some examples, and an implementation of the present disclosure is not limited to the shapes or numerical values shown in the drawings.

In the description herein, "parallel" refers to a state in which an angle formed by two straight lines is above −10° and below 10°, and thus also includes a state in which the angle is above −5° and below 5°. In addition, "vertical" refers to a state in which an angle formed by two straight lines is above 80° and below 100°, and thus also includes a state in which the angle is above 85° and below 95°.

In the specification, a triangle, rectangle, trapezoid, pentagon, hexagon, or the like is not strictly defined, and may be an approximate triangle, rectangle, trapezoid, pentagon, hexagon, or the like, there may be some small deformation caused by tolerance, and there may be chamfers, arc edges, and deformations, etc.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred device or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the description herein, unless otherwise specified and defined explicitly, the terms "connection", "fixed connection", "installation" and "assembly" should be understood in a broad sense, and, for example, a connection may be a fixed connection, a detachable connection or an integrated connection; the terms "installation", "connection" and "fixed connection" may be a direct connection, an indirect connection through intermediate components, or an inner communication between two components. For those of ordinarily skills in the art, meanings of the above terms in the embodiments of the present disclosure may be understood according to situations.

The invention claimed is:

1. A display substrate, comprising a display area and a non-display area located on a periphery of the display area;

the display area comprises a driving structure layer and a light emitting structure layer stacked sequentially on a base substrate, wherein the light emitting structure layer comprises a first electrode layer, a pixel definition layer, a light emitting functional layer, and a second electrode layer; the first electrode layer comprises a plurality of first electrodes disposed on a side of the driving structure layer away from the base substrate;

the pixel definition layer is disposed on a side of the plurality of first electrodes away from the base substrate, and is provided with a plurality of pixel openings and a plurality of flow channels; the plurality of pixel openings expose surfaces of the first electrodes away from the base substrate, a flow channel of the plurality of flow channels is located between each two adjacent pixel openings in a first direction and the plurality of flow channels communicate all the two adjacent pixel openings in the first direction;

the light emitting functional layer comprises a first functional layer and a light emitting layer stacked sequentially along a direction away from the base substrate; the first functional layer is disposed on the surfaces of the plurality of first electrodes away from the base substrate, the first functional layer comprises one film layer or more film layers, at least one film layer of the first functional layer is located in the plurality of pixel openings and the plurality of flow channels; the light emitting layer is disposed on a surface of the first functional layer away from the base substrate and is located in the pixel openings; and the second electrode layer is disposed on a surface of the light emitting functional layer away from the base substrate, and a first electrode, the light emitting functional layer, and the second electrode layer are sequentially stacked to form a light emitting device;

the plurality of flow channels are provided to enable, when the one film layer or more film layers of the first functional layer are formed by an ink jet printing process, the ink forming the first functional layer to flow between the plurality of pixel openings located in the first direction through the plurality of flow channels.

2. The display substrate according to claim 1, wherein the pixel definition layer is in a single layer structure; or the pixel definition layer comprises a first pixel definition layer and a second pixel definition layer; the first pixel definition layer is disposed on the side of the plurality of first electrodes away from the base substrate, and is provided with a plurality of first pixel openings and the plurality of flow channels, the first pixel openings expose the surfaces of the first electrodes away from the base substrate, each flow channel is located between two adjacent first pixel openings in the first direction; the second pixel definition layer is disposed at a side of the first pixel definition layer away from the base substrate, and is provided with a plurality of second pixel openings, positions of the second pixel openings and positions of the first pixel openings correspond to each other, and the second pixel openings and the first pixel openings jointly form the pixel openings, and the plurality of second pixel openings expose two ports of each of the plurality of flow channels.

3. The display substrate according to claim 2, wherein the first pixel definition layer comprises a first sublayer and a second sublayer; the first sublayer is disposed on the side of the plurality of first electrodes away from the base substrate and is provided with the plurality of first pixel openings; the second sublayer is disposed on a surface of the first sublayer away from the base substrate, and the second sublayer comprise a plurality of connection portions, and a connection portion is provided with a flow channel and is located between two adjacent first pixel openings in the first direction.

4. The display substrate according to claim 3, wherein the second pixel definition layer is in a single layer structure; or the second pixel definition layer comprises a third sublayer and a fourth sublayer; the third sublayer is disposed on a side of the first sublayer and the plurality of connection portions away from the base substrate, and is provided with the plurality of second pixel openings; the fourth sublayer is disposed on a side of the third sublayer away from the base substrate, the fourth sublayer comprises a plurality of second banks extending along a second direction, the second direction intersects with the first direction, and the plurality of second banks are disposed at intervals in the first direction; the plurality of pixel openings are disposed in a plurality of rows and a plurality of columns, a plurality of pixel openings disposed along the first direction are a column of pixel openings, a plurality of pixel openings disposed along the second direction are a row of pixel openings, and a row of pixel openings is disposed between two adjacent second banks; and a surface of the first functional layer away from the base substrate is not higher than a surface of the third sublayer away from the base substrate, and the light emitting layer is further disposed on the surface of the third sublayer away from the base substrate.

5. The display substrate according to claim 4, wherein the pixel definition layer extends to the non-display area and a circumferential edge of the pixel definition layer is located in the non-display area; the fourth sublayer further comprises two first banks located in the non-display area and extending along the first direction, and two second banks located in the non-display area and the two first banks form a circumferential edge of the fourth sublayer.

6. The display substrate according to claim 4, wherein a material of the third sublayer is a hydrophilic material, and a material of the fourth sublayer is a hydrophobic material.

7. The display substrate according to claim 3, wherein materials of the first sublayer and the second sublayer are both hydrophilic materials.

8. The display substrate according to claim 2, wherein the first pixel definition layer is in a single layer structure; or, the first pixel definition layer comprises a first sublayer and a second sublayer; the first sublayer is disposed on the side of the plurality of first electrodes away from the base substrate and is provided with a plurality of first openings; the second sublayer is disposed on a surface of the first sublayer away from the base substrate, and is provided with a plurality of second openings and the plurality of flow channels, positions of the second openings and positions of the first openings correspond to each other, and the second openings and the first openings jointly form the first pixel openings.

9. The display substrate according to claim 1, wherein the pixel definition layer comprises a first pixel definition layer and a second pixel definition layer; the first pixel definition layer is disposed at the side of the plurality of first electrodes away from the base substrate, and is provided with the plurality of pixel openings and the plurality of flow channels;

the second pixel definition layer is disposed on a side of the first pixel definition layer away from the base substrate, the second pixel definition layer comprises a plurality of second banks extending along a second direction, the second direction intersects with the first direction, the plurality of second banks are disposed at intervals in the first direction, and the second pixel definition layer exposes two ports of each of the plurality of flow channels;

the plurality of pixel openings are disposed in a plurality of rows and a plurality of columns, a plurality of pixel openings disposed along the first direction are a column of pixel openings, a plurality of pixel openings disposed along the second direction are a row of pixel openings, and a row of pixel openings is disposed between two adjacent second banks; and a surface of the first functional layer away from the base substrate is not higher than a surface of the first pixel definition layer away from the base substrate, and the light emitting layer is further disposed on the surface of the first pixel definition layer away from the base substrate.

10. The display substrate according to claim 9, wherein the pixel definition layer extends to the non-display area and a circumferential edge of the pixel definition layer is located in the non-display area; the second pixel definition layer further comprises two first banks located in the non-display area and extending along the first direction, and two second banks located in the non-display area and the two first banks form a circumferential edge of the second pixel definition layer.

11. The display substrate according to claim 9, wherein the first pixel definition layer is in a single layer structure; or, the first pixel definition layer comprises a first sublayer and a second sublayer; and the first sublayer is disposed on the side of the plurality of first electrodes away from the base substrate and is provided with a plurality of first openings;

the second sublayer is disposed on a surface of the first sublayer away from the base substrate, and is provided with a plurality of second openings and the plurality of flow channels, positions of the second openings and positions of the first opening correspond to each other, and the second openings and the first openings jointly form the pixel openings.

12. The display substrate according to claim 8, wherein a material of the first pixel definition layer is a hydrophilic material, and a material of the second pixel definition layer is a hydrophobic material.

13. The display substrate according to claim 1, wherein the plurality of pixel openings are disposed in a plurality of rows and a plurality of columns, a plurality of pixel openings disposed along the first direction is a column of pixel openings, and a plurality of pixel openings disposed along a second direction is a row of pixel openings, and the first direction intersects with the second direction; a distance between two adjacent pixel openings in the first direction is less than a distance between two adjacent pixel openings in the second direction.

14. The display substrate according to claim 1, wherein the display area comprises a plurality of pixel units arranged in an array on the base substrate, the pixel units comprises a plurality of sub-pixels sequentially arranged along the first direction, and a plurality of sub-pixels located in a second direction emit light of a same color, and the first direction intersects with the second direction.

15. The display substrate according to claim 1, wherein at least one film layer of the first functional layer comprises a plurality of first extension portions extending along the first direction, and the first extension portions are in an integral structure and located in the plurality of pixel openings and the plurality of flow channels in the first direction.

16. The display substrate according to claim 1, wherein the first functional layer comprises a hole injection layer and a hole transport layer stacked sequentially in the direction away from the base substrate, and the hole injection layer and the hole transport layer are each located in the plurality of pixel openings and the plurality of flow channels.

17. A display device, comprising the display substrate according to claim 1.

18. The display substrate according to claim 9, wherein a material of the first pixel definition layer is a hydrophilic material, and a material of the second pixel definition layer is a hydrophobic material.

* * * * *